(12) United States Patent
Asakawa et al.

(10) Patent No.: US 7,728,424 B2
(45) Date of Patent: Jun. 1, 2010

(54) SEMICONDUCTOR DEVICE AND METHOD OF MANUFACTURING THE SAME

(75) Inventors: Tatsuhiko Asakawa, Fujimi-machi (JP); Hiroki Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 175 days.

(21) Appl. No.: 11/493,560

(22) Filed: Jul. 27, 2006

(65) Prior Publication Data

US 2007/0029652 A1    Feb. 8, 2007

(30) Foreign Application Priority Data

Aug. 2, 2005    (JP)    ............................... 2005-223805

(51) Int. Cl.
*H01L 23/12* (2006.01)
(52) U.S. Cl. ...................... 257/701; 438/618
(58) Field of Classification Search .......... 257/E23.169, 257/E23.174, 701; 438/618
See application file for complete search history.

(56) References Cited

U.S. PATENT DOCUMENTS 5,261,158 A * 11/1993 Schreiber et al. .............. 29/848
5,477,087 A * 12/1995 Kawakita et al. ............. 257/737
7,312,533 B2 * 12/2007 Haimerl et al. .............. 257/779
2003/0166333 A1 * 9/2003 Takahashi .................... 438/617
2005/0230773 A1 * 10/2005 Saito et al. .................. 257/433
2005/0236104 A1 * 10/2005 Tanaka ..................... 156/308.2

FOREIGN PATENT DOCUMENTS

| JP | A-2-272737 | 7/1990 |
| JP | A 02-272737 | 11/1990 |
| JP | A-2001-110831 | 4/2001 |
| JP | 2005109100 A * | 4/2005 |

OTHER PUBLICATIONS

Machine translation of JP 2005109100.*

* cited by examiner

*Primary Examiner*—Steven Loke
*Assistant Examiner*—Kimberly M Thomas
(74) *Attorney, Agent, or Firm*—Oliff & Berridge, PLC

(57) ABSTRACT

A semiconductor device including: a semiconductor substrate having an electrode; a resin protrusion formed on a surface of the semiconductor substrate on which the electrode is formed, the resin protrusion extending along a straight line and having a sloping region of which a height decreases along the straight line as a distance from a center of the resin protrusion increases; and an interconnect electrically connected to the electrode and extending over the sloping region of the resin protrusion.

7 Claims, 5 Drawing Sheets

SEMICONDUCTOR DEVICE AND METHOD OF MANUFACTURING THE SAME

Japanese Patent Application No. 2005-223805, filed on Aug. 2, 2005, is hereby incorporated by reference in its entirety.

BACKGROUND OF THE INVENTION

The present invention relates to a semiconductor device and a method of manufacturing the same.

An electronic module has been known in which a semiconductor device is mounted on an interconnect substrate (e.g. JP-A-2-272737). In order to manufacture a highly reliable electronic module, it is important to electrically connect an interconnect pattern of the interconnect substrate with interconnects of the semiconductor device.

SUMMARY

According to a first aspect of the invention, there is provided a semiconductor device comprising:

a semiconductor substrate having an electrode;

a resin protrusion formed on a surface of the semiconductor substrate on which the electrode is formed, the resin protrusion extending along a straight line and having a sloping region of which a height decrease along the straight line as a distance from a center of the resin protrusion increases; and an interconnect electrically connected to the electrode and extending over the sloping region of the resin protrusion.

According to a second aspect of the invention, there is provided a method of manufacturing a semiconductor device, comprising:

providing a semiconductor substrate having an electrode;

forming a resin protrusion extending along a straight line on a surface of the semiconductor substrate on which the electrode is formed so that the resin protrusion has a sloping region of which a height decreases along the straight line as a distance from a center of the resin protrusion increase; and forming an interconnect electrically connected to the electrode to extend over the sloping region of the resin protrusion.

DETAILED DESCRIPTION OF THE EMBODIMENT

Figure 1A:
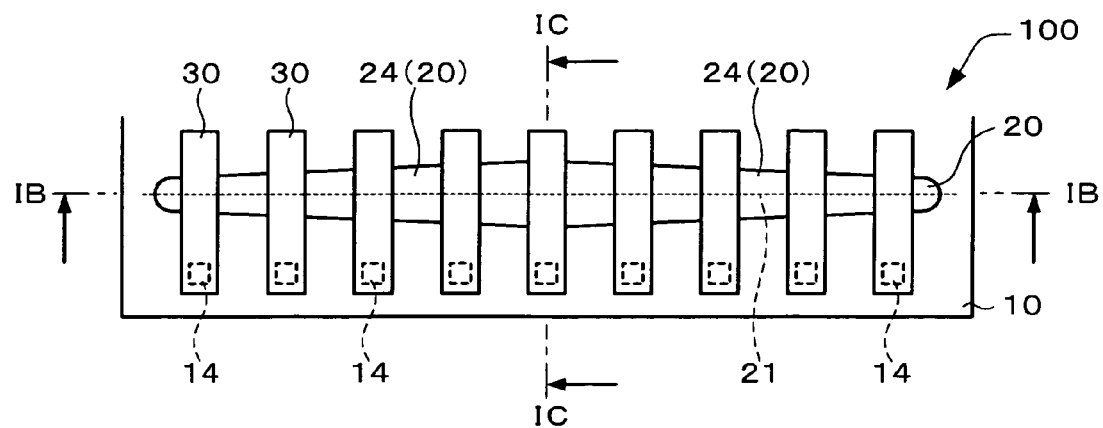
FIGS. 1A to 1C are views illustrative of a semiconductor device according to an embodiment to which the invention is applied.

The invention may provide a semiconductor device exhibiting excellent mounting capability and a method of manufacturing the same.

(1) According to one embodiment of the invention, there is provided a semiconductor device comprising:

a semiconductor substrate having an electrode;

a resin protrusion formed on a surface of the semiconductor substrate on which the electrode is formed, the resin protrusion extending along a straight line and having a sloping region of which a height decreases along the straight line as a distance from a center of the resin protrusion increases; and an interconnect electrically connected to the electrode and extending over the sloping region of the resin protrusion.

This embodiment makes it possible to provide a semiconductor device exhibiting excellent mounting capability.

(2) In this semiconductor device, the sloping region may have a width decreasing as the distance from the center of the resin protrusion increases.

(3) In this semiconductor device, the semiconductor substrate may be a semiconductor chip; and the resin protrusion may extend along one side of the surface of the semiconductor substrate on which the electrode is formed.

(4) In this semiconductor device, a plurality of the interconnects may be formed over the resin protrusion.

(5) According to one embodiment of the invention, there is provided a method of manufacturing a semiconductor device, comprising:

providing a semiconductor substrate having an electrode;

forming a resin protrusion extending along a straight line on a surface of the semiconductor substrate on which the electrode is formed so that the resin protrusion has a sloping region of which a height decreases along the straight line as a distance from a center of the resin protrusion increases; and forming an interconnect electrically connected to the electrode to extend over the sloping region of the resin protrusion.

This embodiment makes it possible to manufacture a semiconductor device exhibiting excellent mounting capability.

(6) In this method of manufacturing a semiconductor device, the resin protrusion may be formed so that a width of the sloping region decreases as the distance from the center of the resin protrusion increases.

(7) In this method of manufacturing a semiconductor device, the step of forming the resin protrusion may include;

extending a resin material on the semiconductor substrate along a straight line so that a width of the resin material decrease along the straight line as a distance from a center of the resin material increases; and curing the resin material.

(8) In this method of manufacturing a semiconductor device, the resin material may be provided to have a uniform thickness; and the resin material may be cured and shrunk to form the resin protrusion.

(9) In this method of manufacturing a semiconductor device, a plurality of the interconnects may be formed over the resin protrusion.

Embodiments according to the invention will be described below with reference to the drawings. Note that the invention is not limited to the following embodiments.

Figure 1B:
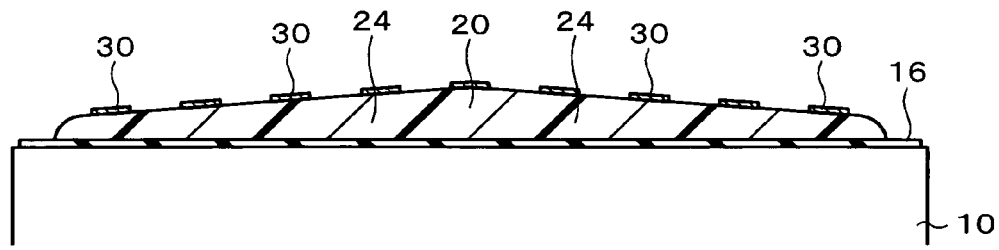

A semiconductor device 100 according to an embodiment to which the invention is applied is described below with reference to FIGS. 1A to 1C. FIG. 1A is a top view of the semiconductor device 100 according to an embodiment to which the invention is applied. FIG. 1B is a cross-sectional view along the line IB-IB in FIG. 1A, and FIG. 1C is a cross-sectional view along the line IC-IC in FIG. 1A.

Figure 1C:
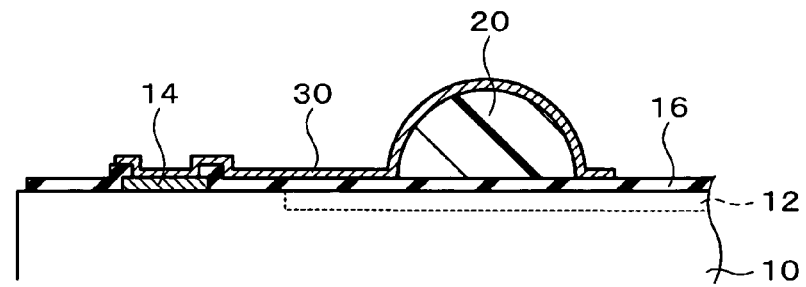
Figure 3:
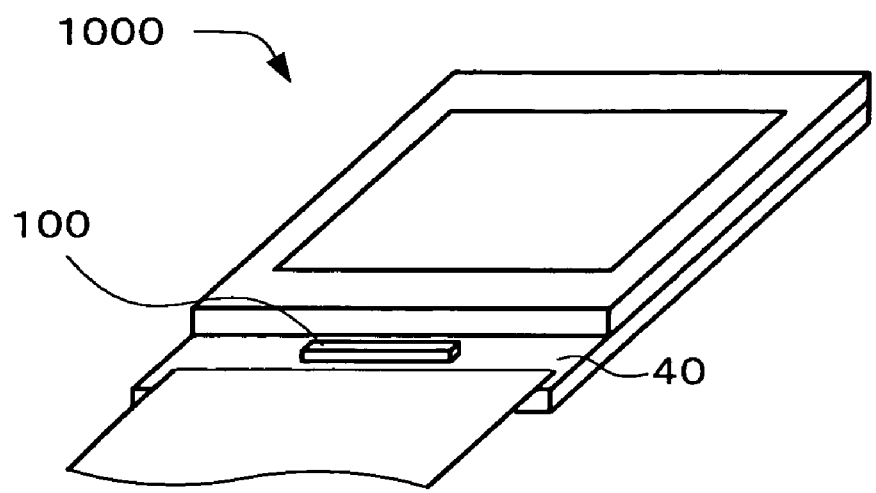
FIG. 3 is a view showing an electronic module on which a semiconductor device according to an embodiment to which the invention is applied is mounted.

As shown in FIGS. 1A to 1C, the semiconductor device according to this embodiment includes a semiconductor substrate 10. The semiconductor substrate 10 may be a silicon substrate or the like. The semiconductor substrate 10 may be in the shape of a chip (see FIG. 3). Specifically, the semiconductor substrate 10 may be a semiconductor chip. Or, the semiconductor substrate 10 may be in the shape of a wafer (see FIG. 4). An integrated circuit 12 may be formed on the semiconductor substrate 10 (see FIG. 1C). The configuration of the integrated circuit 12 is not particularly limited. For example, the integrated circuit 12 may include an active element such as a transistor and a passive element such as a resistor, coil, or capacitor. When the semiconductor substrate 10 is in the shape of a chip, the surface (active surface) of the semiconductor substrate 10 on which the integrated circuit 12 is formed may be rectangular. The active surface of the semiconductor substrate 10 may be square.

As shown in FIGS. 1A and 1C, the semiconductor substrate 10 is provided with electrodes 14. The electrode 14 may be electrically connected with the inside of the semiconductor substrate 10. The electrode 14 may be electrically connected with the integrated circuit 12. A conductor which is not electrically connected with the integrated circuit 12 may also be referred to as the electrode 14. The electrode 14 may be part of an internal interconnect of the semiconductor substrate. In this case, the electrode 14 may be part of the internal interconnect of the semiconductor substrate used for electrical connection with the outside. The electrode 14 may be formed of a metal such as aluminum or copper. The electrodes 14 may be arranged along one side of the active surface of the semiconductor substrate 10.

As shown in FIGS. 1B and 1C, the semiconductor substrate 10 may be provided with a passivation film 16. The passivation film 16 may be formed to expose the electrode 14. The passivation film 16 may have an opening which exposes the electrode 14. The passivation film may be an inorganic insulating film formed of $SiO_2$, SiN, or the like. The passivation film 16 may be an organic insulating film formed of a polyimide resin or the like.

As shown in FIGS. 1A to 1C, the semiconductor device according to this embodiment includes a resin protrusion 20 formed on the semiconductor substrate 10. The resin protrusion 20 is formed on the surface of the semiconductor substrate 10 on which the electrodes 14 are formed. The resin protrusion 20 may be formed on the passivation film 16. The material for the resin protrusion 20 is not particularly limited. A known material may be used for the resin protrusion 20. For example, the resin protrusion 20 may be formed using a resin such as a polyimide resin, silicone-modified polyimide resin, epoxy resin, silicone-modified epoxy resin, benzocyclobutene (BCB), polybenzoxazole (PBO), or phenol resin.

As shown in FIG. 1A, the resin protrusion 20 extends along a straight line 21. The straight line 21 may be a virtual straight line which extends over the semiconductor substrate 10. When the semiconductor substrate 10 is a semiconductor chip, the resin protrusion 20 may extend along one side of the semiconductor substrate 10. When the active surface of the semiconductor substrate 10 is rectangular the resin protrusion 20 may extend along the long side of the active surface. Or, the resin protrusion 20 may extend in one direction. The resin protrusion 20 may have a curved surface. As shown in FIG. 1C, the cross-sectional shape of the resin protrusion 20 may be a semicircle.

As shown in FIGS. 1A and 1B, the resin protrusion 20 includes a sloping region 24 of which the height decreases along the straight line 21 as the distance from the center of the resin protrusion 20 increases. Specifically, the resin protrusion 20 may have a shape in which the height decreases as the distance from the center increases. Or, the resin protrusion 20 may have a structure in which the height (continuously) decreases along the straight line 21 as the distance from the center of the resin protrusion 20 increases. One resin protrusion 20 may include two sloping regions 24. The term "height of the resin protrusion 20" used herein may refer to the height of the resin protrusion 20 with respect to the surface of the semiconductor substrate 10 on which the electrodes 14 are formed.

As shown in FIG. 1A, the sloping region 24 may be formed so that the width of the sloping region 24 decreases as the distance from the center of the resin protrusion 20 increases. Specifically, the resin protrusion 20 may have a shape in which the width decreases as the distance from the center of the resin protrusion 20 increases. Or, the resin protrusion 20 may have a structure in which the width (continuously) decreases along the straight line 21 as the distance from the center of the resin protrusion 20 increases. The term "width of the resin protrusion 20" used herein may refer to the width of the lower portion of the resin protrusion 20. In other words, the term "width of the rein protrusion 20" used herein may refer to the width of the surface (bottom surface) of the resin protrusion 20 which faces the semiconductor substrate 10. Note that the sloping region 24 may be formed to have a uniform width (not shown).

As shown in FIGS. 1A to 1C, the semiconductor device according to this embodiment includes interconnects 30. The interconnect 30 is electrically connected with the electrode 14. The interconnect 30 is formed to extend over (reach) the resin protrusion 20. The interconnect 30 may be formed to extend over the sloping region 24. In this case, the portion of the interconnect 30 disposed over the sloping region 24 may extend to intersect the straight line 21 (see FIG. 1A). The interconnect 30 may be formed to extend over the top of the resin protrusion 20. As shown in FIGS. 1A and 1B, a plurality of interconnects 30 may be formed to extend over one resin protrusion 20. Or, only one interconnect 30 may be formed over one resin protrusion 20 (not shown). The structure and the material for the interconnect 30 are not particularly limited. For example, the interconnect 30 may be formed of a single layer. Or, the interconnect 30 may be formed of a plurality of layers. In this case, the interconnect 30 may include a first layer formed of titanium tungsten or titanium and a second layer formed of gold (not shown).

The semiconductor device according to this embodiment may have the above-described configuration. According to the semiconductor device 100, a semiconductor device exhibiting excellent mounting capability can be provided. Specifically, the semiconductor device 100 allows a highly reliable electronic module 1000 (see FIG. 3) to be efficiently manufactured. The effects of the semiconductor device 100 are described below.

A method of mounting the semiconductor device 100 on an interconnect substrate is not particularly limited. An example of the mounting method is described below with reference to FIGS. 2A to 2C. An interconnect substrate 40 is described below. The interconnect substrate 40 may include a base substrate 42 and an interconnect pattern 44. The material for the base substrate 42 is not particularly limited. The material for the base substrate 42 may be an organic or inorganic material, or may be a composite structure of organic and inorganic materials. A substrate formed of an inorganic material may be used as the base substrate 42. In this case the base substrate 42 may be a ceramic substrate or a glass substrate. When the base substrate 42 is a glass substrate, the interconnect substrate 40 may be part of an electro-optical panel (e.g. liquid crystal panel or electroluminescent panel). The interconnection pattern 44 may be formed of a metal film or a metal compound film such as indium tin oxide (ITO), Cr, or Al, or a composite of such films. The interconnection pattern 44 may be electrically connected with an electrode which drives a liquid crystal (e.g. scan electrode, signal electrode, or common electrode). The base substrate 42 may be a substrate or a film formed of polyethylene terephthalate (PET). Or, a flexible substrate formed of a polyimide resin may be used as the base substrate 42. As the flexible substrate, a tape used in a flexible printed circuit (FPC) or tape automated bonding (TAB) technology may be used. In this case, the interconnect pattern 44 may be formed by, stacking any of copper (Cu), chromium (Cr), titanium (Ti), nickel (Ni), and titanium tungsten (Ti—W), for example. The interconnect pattern 44 includes an electrical connection section 45. The electrical connection section 45 is the part of the interconnect pattern 44 used for electrical connection with another member. The interconnect pattern 44 may be formed to partially extend inside the base substrate 42.

Figure 2A:
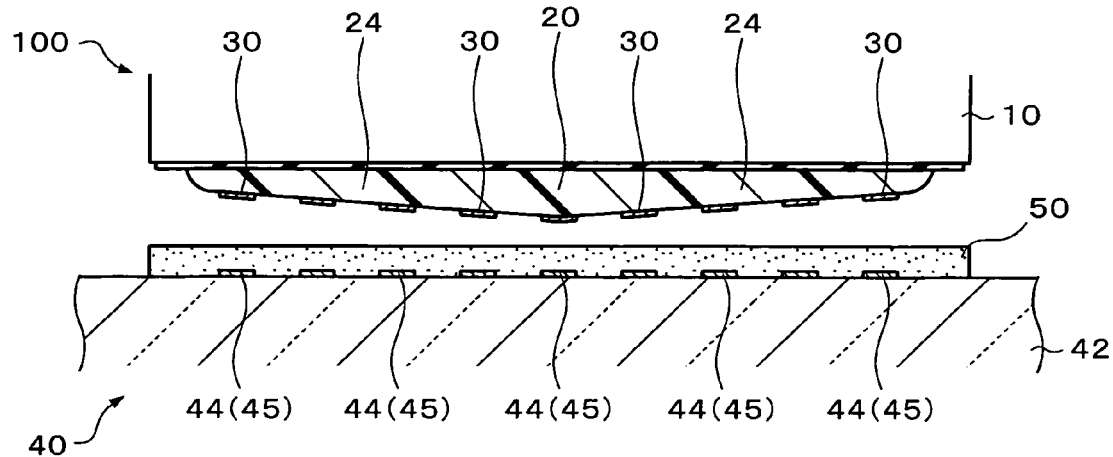
FIGS. 2A to 2C are views illustrative of a semiconductor device according to an embodiment to which the invention is applied.
Figure 2B:
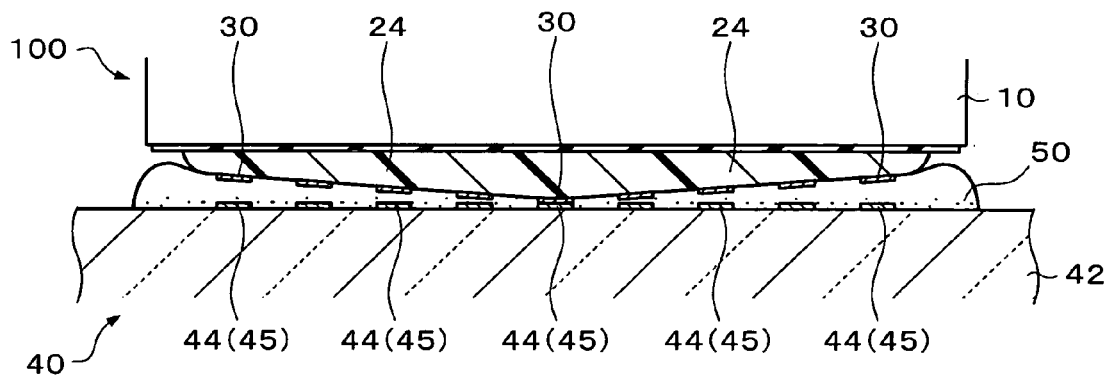
Figure 2C:
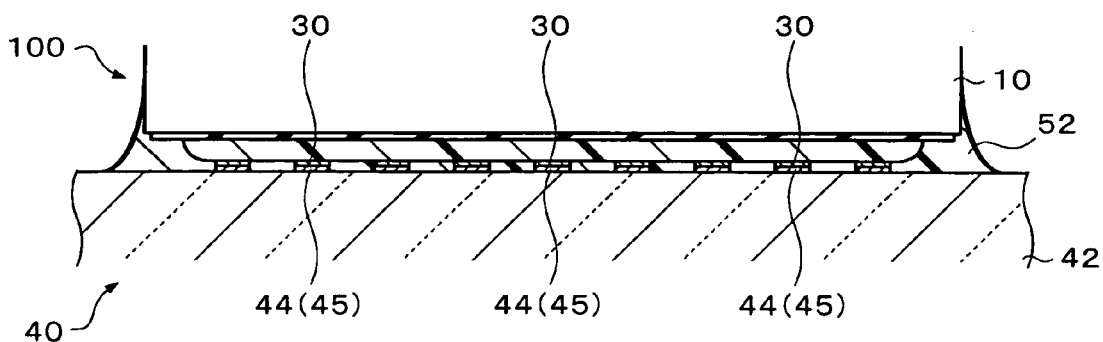

A step of mounting the semiconductor device 100 on the interconnect substrate 40 is described below. As shown in FIG. 2A, the semiconductor device 100 is disposed on the interconnect substrate 40 and positioned so that the interconnect 30 (resin protrusion 20) of the semiconductor device 100 faces the interconnect pattern 44 (electrical connection section 45) of the interconnect substrate 40. In this case, an adhesive 50 may be provided between the semiconductor device 100 and the interconnect substrate 40. A film-shaped adhesive may be used as the adhesive 50, for example. A paste adhesive may also be used as the adhesive 50. The adhesive 50 may be an insulating adhesive. The adhesive 50 may be a resin adhesive. As shown in FIG. 2B, the semiconductor device 100 is pressed against the interconnect substrate 40 to allow the interconnect 30 to contact the interconnect pattern 44 (electrical connection section 45). The adhesive 50 may be caused to flow due to the resin protrusion 20 (interconnect 30) (see FIG. 2B). This step way be performed with heating. This increases the flowability of the adhesive 50. The resin protrusion 20 may be crushed using the semiconductor substrate 10 and the interconnect substrate 40 to elastically deform the resin protrusion 20 (see FIG. 2C). This allows the interconnect 30 to be pressed against the electrical connection section 45 (interconnect pattern 44) due to the elastic force of the resin protrusion 20, whereby an electronic module exhibiting high electrical connection reliability can be manufactured. The adhesive 50 may be cured after the step of mounting the semiconductor device 100 on the interconnect substrate 40 to form an adhesive layer 52, as shown in FIG. 2C. The interval between the semiconductor substrate 10 and the interconnect substrate 40 may be maintained using the adhesive layer 52. Specifically, the elastically deformed state of the resin protrusion 20 may be maintained using the adhesive layer 52. For example, the elastically deformed state of the resin protrusion 20 may be maintained by curing the adhesive 50 in a state in which the resin protrusion 20 is crushed (state in which the resin protrusion 20 is elastically deformed).

The semiconductor device 100 may be mounted on the interconnect substrate 40 by the above steps. An inspection step and the like may be further performed to obtain the electronic module 1000 shown in FIG. 3.

In the step of mounting the semiconductor device 100 on the interconnect substrate 40, when providing the adhesive 50 in advance between the semiconductor device 100 and the interconnect substrate 40, the adhesive 50 is caused to flow due to the resin protrusion 20, as described above. In order to electrically connect the interconnect 30 of the semiconductor device 100 with the interconnect pattern 44 (electrical connection section 45), it is important to mount the semiconductor device 100 so that the adhesive 50 does not remain between the interconnect 30 and the electrical connection section 45. In other words, if the adhesive 50 can be efficiently removed from the space between the interconnect 30 and the electrical connection section 45 in the step of mounting the semiconductor device 100 on the interconnect substrate 40, a highly reliable electronic module can be efficiently manufactured.

On the other hand, when the adhesive 50 has a high flow resistance, the adhesive 50 may apply a large amount of force to the resin protrusion 20. In particular, when the flows of the adhesive 50 occur in such directions that one flow hinders the other flow, a large amount of force is applied to the resin protrusion 20 which encounters these flows, whereby the resin protrusion 20 is easily deformed. If the resin protrusion 20 is deformed, the adhesive 50 remains between the interconnect 30 and the interconnect pattern 44 (electrical connection section 45), thereby affecting the reliability of the electronic module.

The resin protrusion 20 of the semiconductor device 100 includes the sloping region 24, as described above. Specifically, the resin protrusion 20 has a portion of which the height decreases as the distance from the center of the resin protrusion 20 increases. Therefore, the semiconductor device 100 causes the adhesive 50 to flow (only) in the direction away from the center of the resin protrusion 20. As a result, the resin protrusion 20 allows the adhesive 50 to flow so that the flow of the adhesive 50 is not hindered (i.e. the opposing flows do not hinder the other). Therefore, the resin protrusion 20 allows the adhesive 50 to be efficiently and reliably removed from the space between the sloping region 24 (interconnect 30) and the interconnect substrate 40 (electrical connection section 45). Since the interconnect 30 is formed to extend over the sloping region 24, the interconnect 30 and the electrical connection section 45 can be reliably electrically connected. Specifically, the semiconductor device 100 allows efficient manufacture of a highly reliable electronic module.

When the sloping region 24 is formed so that the width decreases as the distance from the center of the resin protrusion increases, the adhesive 50 can be more efficiently removed. Therefore, a semiconductor device exhibiting more excellent mounting capability can be provided.

As described above, the resin protrusion 20 is formed so that the height decreases as the distance from the center increases. In other words, the resin protrusion 20 is formed so that the height increases toward the center. Therefore, when mounting the semiconductor device 100 on a flat interconnect substrate, the resin protrusion 20 is subjected to a larger amount of force and is deformed to a larger extent as the distance from the center decreases. Specifically, the resin protrusion 20 is deformed to a larger extent as the distance from the center decreases. However, when the sloping region 24 is formed so that the width increases as the distance from the center of the resin protrusion 20 decreases, the breaking strength of the center of the resin protrusion 20 can be increased. Therefore, a highly reliable electronic module can be provided.

Figure 4:
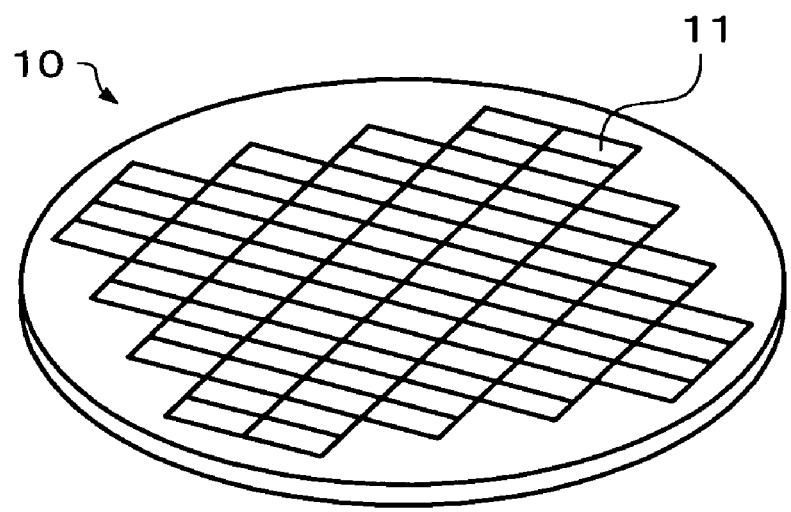
FIG. 4 is a view illustrative of a method of manufacturing a semiconductor device according to an embodiment to which the invention is applied.
Figure 5A:
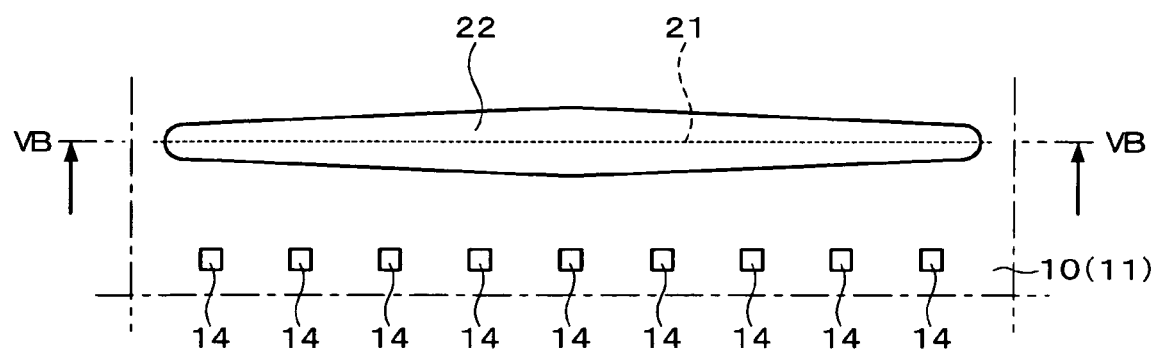
FIGS. 5A and 5B are views illustrative of a method of manufacturing a semiconductor device according to an embodiment to which the invention is applied.
Figure 5B:
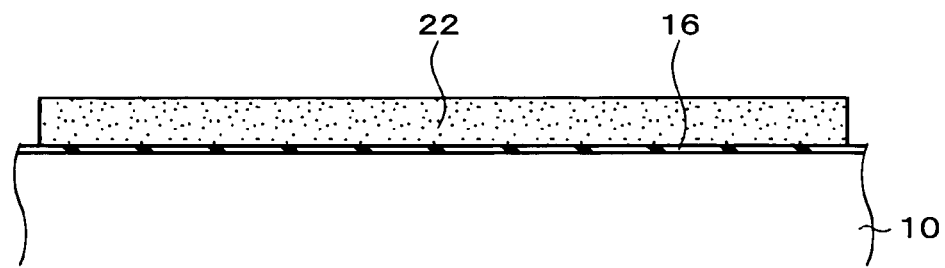

A method of manufacturing the semiconductor device 100 is described below. FIGS. 4 to 5B are illustrative of the method of manufacturing the semiconductor device 100.

The method of manufacturing a semiconductor device according to this embodiment may include providing the semiconductor substrate 10. The semiconductor substrate 10 may be in the shape of a wafer, as shown in FIG. 4. The semiconductor substrate 10 in the shape of a wafer may include regions 11 in which semiconductor devices are respectively formed. Specifically, the semiconductor substrate 10 may have a structure in which a plurality of semiconductor chips are integrated. Note that a semiconductor substrate in the shape of a chip may also be utilized.

The method of manufacturing a semiconductor device according to this embodiment includes forming the resin protrusion 20 on the semiconductor substrate 10 (see FIGS. 1A to 1C). The resin protrusion 20 is formed on the surface of the semiconductor substrate 10 on which the electrodes 14 are formed. The resin protrusion 20 is formed to extend along a straight line 21. The resin protrusion 20 is formed to include the sloping region 24 of which the height decreases along the straight line 21 as the distance from the center of the resin protrusion 20 increases. The resin protrusion 20 may be formed so that the width of the sloping region 24 decreases as the distance from the center of the resin protrusion 20 increases.

The formation method for the resin protrusion 20 is not particularly limited. For example, the resin protrusion 20 may be formed by providing a resin material 22 on the semiconductor substrate 10 and caring the resin material 22. In this case, the resin material 22 may be provided so that the resin material 22 extends along a straight line and the width decreases along the straight line as the distance from the center increases, as shown in FIG. 5A. Specifically, the resin material 22 may be provided to have a planar shape which extends along a straight line and of which the width decreases along the straight line as the distance from the center increases. The term "width of the resin material 22" used herein may refer to the width of the lower portion of the resin material 22. In other words, the term "width of the resin material 22" used herein may refer to the width of the surface (bottom surface) of the resin material 22 which faces the semiconductor substrate 10. As shown in FIG. 5B, the resin material 22 may be provided to a uniform thickness. FIG. 5B is a cross-sectional view along the line VB-VB in FIG. 5A. When providing the resin material 22 to a uniform thickness, the resin protrusion 20 can be formed to include the sloping region 24 by causing the resin material 22 to undergo cure shrinkage (see FIG. 1B). According to this method, the resin protrusion 20 can be easily and efficiently formed. Note that the formation method for the resin protrusion 20 is not limited to the above method. For example, the resin protrusion 20 may be formed by molding.

The method of manufacturing a semiconductor device according to this embodiment includes forming the interconnect 30. The interconnect 30 is formed to be electrically connected with the electrode 14. The interconnect 30 is formed to extend over the resin protrusion 20. The interconnect 30 is formed to extend over the sloping region 24. This step may be performed so that a plurality of interconnects 30 extend over one resin protrusion 20. The formation method for the interconnect 30 is not particularly limited. A known method may be used to form the interconnect 30.

The semiconductor device 100 may be formed by the above steps after arbitrarily performing steps such as an inspection step and a cutting step (see FIGS. 1A to 1C). This allows manufacture of a semiconductor device exhibiting excellent mounting capability.

Figure 6A:
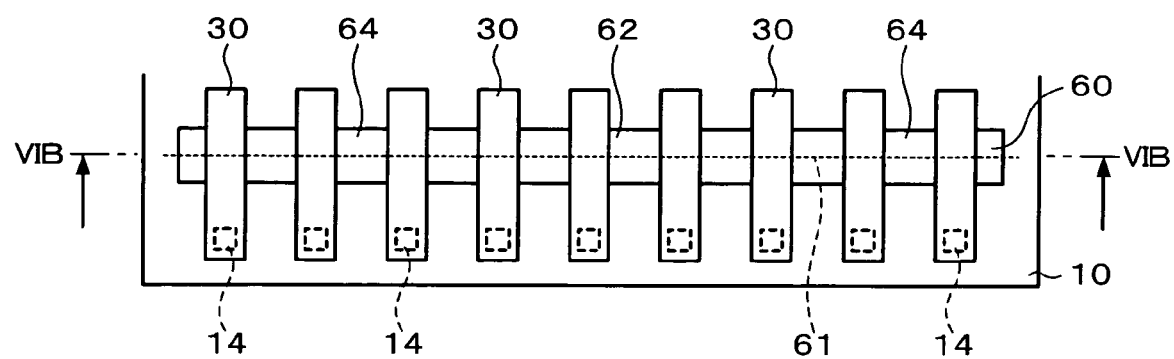
FIGS. 6A and 6B are views illustrative of a semiconductor device according to a modification of an embodiment to which the invention is applied.
Figure 6B:
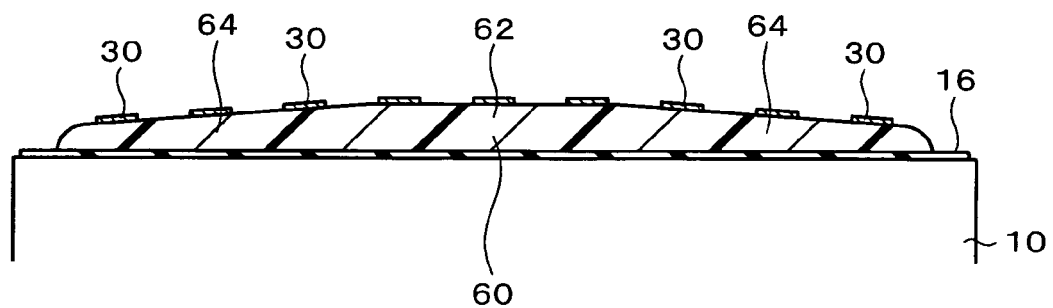

A semiconductor device according to a modification of the embodiment to which the invention is applied is described below with reference to the drawings. FIGS. 6A and 6B are views illustrative of the semiconductor device according to this modification.

The semiconductor device shown in FIGS. 6A and 6B includes a resin protrusion 60. As shown in FIG. 6A, the resin protrusion 60 extends along a straight line 61. The resin protrusion 60 includes a center region 62. The center region 62 may have a shape in which the height does not change along the straight line 61. Specifically, the top surface of the center region 62 may be flat along the straight line 61. The resin protrusion 60 includes a sloping region 64. The sloping regions 64 are disposed on both sides of the center region 62. In more detail, the sloping regions 64 are disposed on both sides of the center region 62 along the straight line 61. The sloping region 64 is a region of which the height decreases along the straight line 61 as the distance from the center of the resin protrusion 20 increases. The resin protrusion 60 may have a shape in which the width does not change along the straight line 61. Specifically, the sloping region 64 may have a uniform width. The center region 62 and the sloping region 64 may have the same width. Note that the resin protrusion 60 may have a shape in which the width decreases as the distance from the center of the resin protrusion 60 increases (see FIG. 1A). Or, the resin protrusion 60 may have a shape in which the center region 62 has a uniform width and the width of the sloping region 64 decreases along the straight line 61 as the distance from the center of the resin protrusion 60 increases (not shown).

As shown in FIGS. 6A and 6B, the interconnect 30 is formed to extend over the resin protrusion 60. The interconnect 30 may be formed to extend over the center region 62. The interconnect 30 may be formed to extend over the sloping region 64. The interconnect 30 may be formed so that the interconnect 30 extends to intersect the straight line 61 over the resin protrusion 60. Note that the interconnect 30 may be formed only over the sloping region 64 to avoid the center region 62 (not shown).

This semiconductor device also allows the resin material to be efficiently and reliably removed from the space between the resin protrusion and the interconnect substrate. Therefore, a semiconductor device which allows efficient manufacture of a highly reliable electronic modules can be provided.

The invention is not limited to the above embodiments. Various modifications and variations may be made. For example, the invention includes various other configurations substantially the same as the configurations described in the embodiments (such as a configuration having the same function, method, and results, or a configuration having the same objective and results). The invention also includes a configuration in which an unsubstantial portion in the embodiments is replaced. The invention also includes a configuration having the same effects as the configurations described in the embodiments, or a configuration capable of achieving the same objective as the configurations described in the embodiments. Further, the invention includes a configuration in which a known technique is added to the configurations described in the embodiments.

Although only some embodiments of the invention have been described in detail above those skilled in the art will readily appreciate that many modifications are possible in the embodiments without materially departing from the novel teachings and advantages of this invention. Accordingly, all such modifications are intended to be included within the scope of this invention.

What is claimed is:

1. A semiconductor device comprising:
a semiconductor substrate that has a first electrode and a second electrode;
an insulating film that is formed on a first surface of the semiconductor substrate on which the first electrode and the second electrode are formed, the insulating film having a first opening and a second opening, the first opening being positioned on the first electrode, and the second opening being positioned on the second electrode;
a resin protrusion that is formed on the insulating film, the resin protrusion extending along a line and having a first sloping region of which a height decreases along the line as a distance from a center of the resin protrusion increases, the first sloping region being positioned between the center of the resin protrusion and a first end of the resin protrusion;
a first interconnect that is electrically connected to the first electrode, a first portion of the first interconnect being disposed on the first electrode, a second portion of the first interconnect being disposed on the insulating film, and a third portion of the first interconnect being disposed on the first sloping region of the resin protrusion, the third portion of the first interconnect being disposed between the first portion of the first interconnect and the second portion of the first interconnect; and
a second interconnect that is electrically connected to the second electrode, a first portion of the second interconnect being disposed on the second electrode, a second portion of the second interconnect being disposed on the insulating film, and a third portion of the second interconnect being disposed on the first sloping region of the resin protrusion, the third portion of the second interconnect being disposed between the first portion of the second interconnect and the second portion of the second interconnect, wherein
the first interconnect is closer to the center of the resin protrusion than the second interconnect, and
a highest portion of the first interconnect is higher than a highest portion of the second interconnect.

2. The semiconductor device as defined in claim 1, wherein the first sloping region has a width decreasing as the distance from the center of the resin protrusion increases.

3. The semiconductor device as defined in claim 1, wherein
the semiconductor substrate is a semiconductor chip, and
the resin protrusion extends along one side of the first surface of the semiconductor substrate on which the first electrode and second electrode are formed.

4. The semiconductor device as defined in claim 1, wherein
the resin protrusion has a second sloping region of which a height decreases along the line as a distance from the center of the resin protrusion increases,
the second sloping region is positioned between the center of the resin protrusion and a second end of the resin protrusion, and
the center of the resin protrusion is positioned between the first end of the resin protrusion and the second end of the resin protrusion.

5. The semiconductor device as defined in claim 1, wherein the center of the resin protrusion is the highest of the resin protrusion.

6. The semiconductor device as defined in claim 1, wherein the first electrode and the second electrode are arranged along the line.

7. The semiconductor device as defined in claim 1, wherein
the first surface of the semiconductor substrate is rectangular, and
the resin protrusion extends along the long side of the first surface of the semiconductor substrate.

* * * * *